(12) United States Patent
Dong et al.

(10) Patent No.: US 12,166,607 B2
(45) Date of Patent: Dec. 10, 2024

(54) DIGITAL ISOLATOR AND DIGITAL SIGNAL TRANSMISSION METHOD

(71) Applicant: Silergy Semiconductor Technology (Hangzhou) LTD, Zhejiang (CN)

(72) Inventors: Yufei Dong, Hangzhou (CN); Xiaodong Huang, Hangzhou (CN); Ye Yuan, Hangzhou (CN); Chen Zhao, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 32 days.

(21) Appl. No.: 18/096,653

(22) Filed: Jan. 13, 2023

(65) Prior Publication Data

US 2023/0231745 A1 Jul. 20, 2023

(51) Int. Cl.
*H04L 25/02* (2006.01)
*H03M 13/37* (2006.01)
*H04L 25/49* (2006.01)

(52) U.S. Cl.
CPC ........ *H04L 25/0266* (2013.01); *H03M 13/37* (2013.01); *H04L 25/49* (2013.01)

(58) Field of Classification Search
CPC ........... G11C 7/10; G11C 7/22; G11C 11/406; G11C 11/409; H02M 1/08; H02M 3/335; H03M 5/16; H03M 13/37; H04L 1/00; H04L 25/02; H04L 25/03; H04L 25/06; H04L 25/08; H04L 25/49; H04L 25/0266; H04L 25/0292; H04L 27/10
USPC ........ 375/219, 259, 271, 295, 316, 375, 377
See application file for complete search history.

(56) References Cited

U.S. PATENT DOCUMENTS

| | | | |
|---|---|---|---|
| 8,847,503 B2 | 9/2014 | Chang et al. | |
| 9,673,721 B2 | 6/2017 | Trescases et al. | |
| 9,973,220 B2 | 5/2018 | Kramer et al. | |
| 10,038,403 B2 | 7/2018 | Kamath et al. | |
| 11,515,900 B1* | 11/2022 | Li | H04B 1/04 |
| 2020/0279602 A1* | 9/2020 | Nasum | G11C 11/40615 |
| 2022/0077860 A1* | 3/2022 | Ding | H04L 25/0266 |

* cited by examiner

*Primary Examiner* — Shawkat M Ali

(57) ABSTRACT

A digital isolator can include: an encoding circuit configured to receive and encode an input digital signal, in order to generate an encoded signal, wherein a rising edge of the input digital signal is encoded as a first pulse sequence, and a falling edge of the input digital signal is encoded as a second pulse sequence; an isolation element coupled to the encoding circuit, and being configured to transmit the encoded signal in an electrically isolated manner; and a decoding circuit configured to receive the encoded signal through the isolation element, and to decode the encoded signal, in order to generate an output digital signal consistent with the input digital signal.

20 Claims, 7 Drawing Sheets

DIGITAL ISOLATOR AND DIGITAL SIGNAL TRANSMISSION METHOD

RELATED APPLICATIONS

This application claims the benefit of Chinese Patent Application No. 202210043257.X, filed on Jan. 14, 2022, which is incorporated herein by reference in its entirety.

FIELD OF THE INVENTION

The present invention generally relates to the field of power electronics, and more particularly to digital isolators and associated digital signal transmission methods.

BACKGROUND

In an electronic system, a digital isolator is a device that has a high resistance isolation characteristic when a digital signal and an analog signal are transmitted, in order to realize isolation between an electronic system and the user. Circuit designers typically introduce isolation to meet safety requirements, or to reduce the noise of the grounding loop. Current isolation can ensure that data transmission is not through electrical connection or a leakage path, thereby avoiding security risks.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Figure 1:
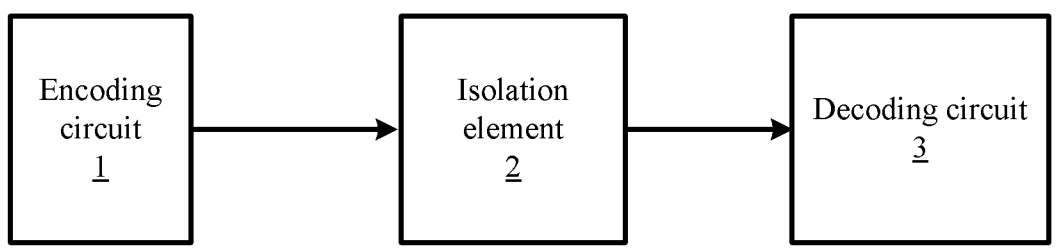
FIG. 1 is a schematic block diagram of an example digital isolator, in accordance with embodiments of the present invention.

Referring now to FIG. 1, shown is a schematic block diagram of an example digital isolator, in accordance with the embodiments of the present invention. The digital isolator can include encoding circuit 1, isolation element 2, and decoding circuit 3. Encoding circuit 1 may receive an input digital signal, and encode a rising edge and a falling edge of the input digital signal into different encoded signals. Isolation element 2 can connect with encoding circuit 1, and may transmit the encoded signals in an electrically isolated manner. Decoding circuit 3 can connect with isolation element 2, and may receive the encoded signal to decode to output the rising edge and the falling edge, in order to obtain the output digital signal consistent with the input digital signal. In this way, encoding and transmission of the input digital signal are realized.

In particular embodiments, encoding circuit 1 may start to output the encoded signal after detecting the rising edge or the falling edge. For example, encoding circuit 1 can encode the rising edge of input digital signal DIN into a first pulse sequence, and the falling edge into a second pulse sequence. The first pulse sequence can include a plurality of first pulse groups, and the time interval between the first pulse groups is a first time. The second pulse sequence can include a plurality of second pulse groups, and the time interval between the second pulse groups is a second time, which is different from the first time. Also, each of the first pulse groups and the second pulse groups can include at least one pulse, which can be a single pulse or a pulse sequence including a plurality of continuous pulses. Therefore, by configuring the pulses into the pulse group in a predetermined way, arranging a plurality of pulse groups according to a predetermined time interval to form corresponding pulse sequences, and respectively representing the rising edge and the falling edge of the input digital signal by different pulse sequences, the encoded signal can include pulse information, pulse group information, and pulse sequence information. In this way, the information content is richer and the anti-interference ability of the encoded signal can be improved.

In addition, due to differences between the first pulse sequence and the second pulse sequence, isolation element 2 may transmit the pulse sequences to decoding circuit 3 in an electrically isolated manner (e.g., the input terminal and the output terminal are not common grounded). Then, decoding circuit 3 may decode in order to output the rising edge after receiving the first pulse sequence, and to output the falling edge of the output after receiving the second pulse sequence.

For example, since the first and second pulse sequences have different time intervals, and the time intervals corresponding to the first and second pulse sequences are both determined, decoding circuit 3 may determine that the first pulse sequence is detected when detecting that the time interval of the pulse sequence in the encoded signal is the first time, and can generate the rising edge at the output terminal. When detecting that the time interval of pulse sequence in the encoded signal is the second time, it may be determined that the second pulse sequence is detected, and the falling edge can be output at the output terminal. Therefore, decoding circuit 3 can accurately generate the rising edge and the falling edge according to the time interval corresponding to the pulse sequence, may further generate the output digital signal with the same waveform as the input digital signal, and may improve the anti-interference ability in the digital signal transmission process.

In particular embodiments, encoding circuit 1 and decoding circuit 3 can be formed by an edge detection circuit, a signal modulator, and a carrier generator. For example, isolation element 2 can be a capacitor or a micro transformer. Moreover, when encoding circuit 1 generates a single signal, correspondingly, a single-ended transmission isolation element can be adopted. When encoding circuit 1 generates a two-way differential signal, correspondingly, the differential transmission isolation element may be adopted to further improve the anti-interference ability in the process of pulse sequence transmission and the anti-interference performance of the digital isolator.

In particular embodiments, the rising edge and the falling edge of the input digital signal can respectively be encoded into the first and second pulse sequences by the encoding circuit. The first pulse sequence can be characterized by a plurality of first pulse groups with the first time interval, and the second pulse sequence can be characterized by a plurality of second pulse groups with the second time interval. In this way, more associated information can be added to the encoded signal, and the anti-interference ability of the encoded information may be improved. In addition, the encoded information corresponding to the rising edge and falling edge can be transmitted by the isolation element, and the rising edge and falling edge of the output signal may be determined by the decoding circuit according to the time interval of the pulse signals in the encoded signal. In this way, the encoding and transmission of the input digital signal can be realized, and the anti-interference ability of the encoded signal and the anti-interference performance of the digital isolator improved.

Figure 2:
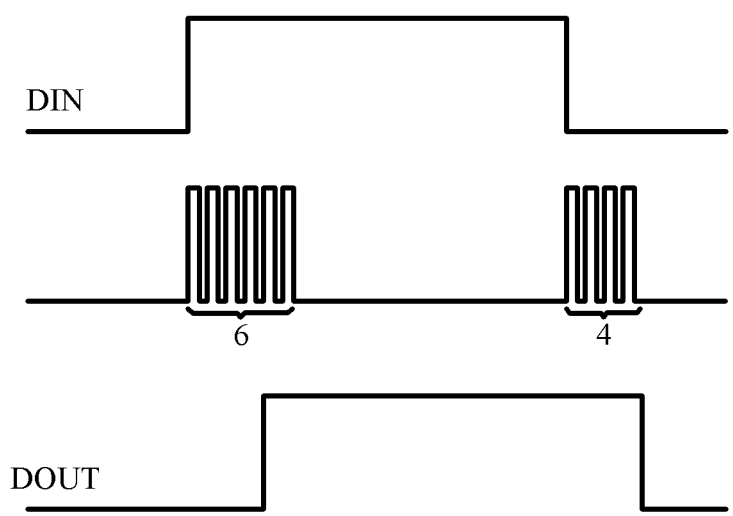
FIG. 2 is a waveform diagram of example operation of the digital isolator, in accordance with embodiments of the present invention.

Referring now to FIG. 2, shown is a waveform diagram of example operation of the digital isolator. In the example digital isolator, the rising edge of input digital signal DIN can correspondingly be encoded into six consecutive pulses, and the falling edge may correspondingly be encoded into four consecutive pulses. Therefore, at the decoding end, the rising edge and the falling edge can be identified by counting the number of continuous pulses in a predetermined period, and output digital signal DOUT can be obtained. However, the digital isolator using this encoding approach may have relatively poor the anti-interference ability in some cases. If electromagnetic interference occurs during the transmission process, resulting in the change in the number of continuous pulses, this may lead to decoding errors at the decoding end in some cases.

Figure 3:
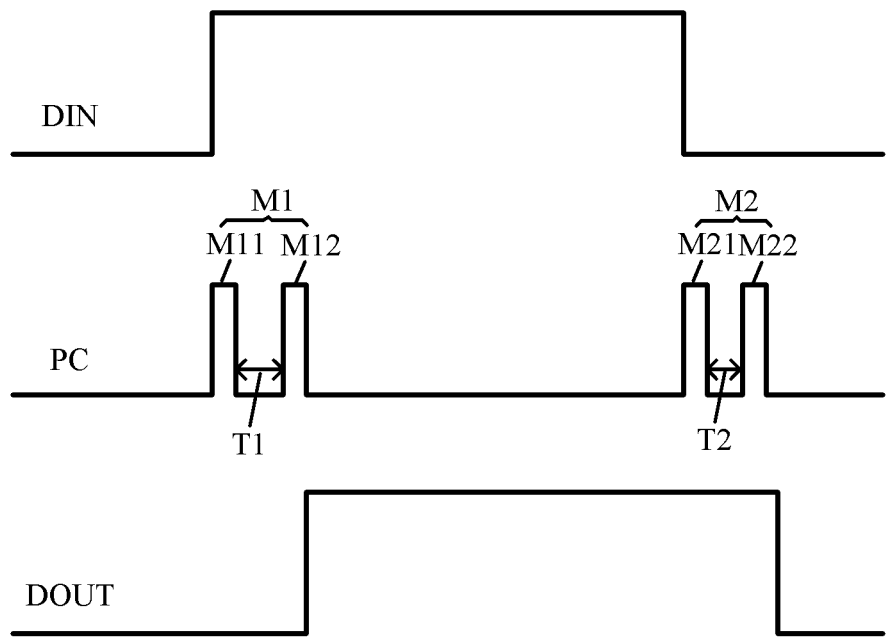
FIG. 3 is a waveform diagram of first example operation of the digital isolator, in accordance with embodiments of the present invention.

Referring now to FIG. 3, shown is a waveform diagram of first example operation of the digital isolator, in accordance with the embodiments of the present invention. In this particular example, pulse sequence M1 corresponding to the rising edge of input digital signal DIN can include two first pulse groups (e.g., pulse groups M11 and M12). Pulse groups M11 and M12 may both include one pulse as an example. The time interval between pulse groups M11 and M12 is T1. Further, pulse sequence M2 corresponding to the falling edge of input digital signal DIN can include two second pulse groups (e.g., pulse groups M21 and M22). Both pulse groups M21 and M22 include one pulse as an example. The time interval between pulse groups M21 and M22 is T2. Therefore, by using pulse groups with different time intervals to form different pulse sequences, the information in the encoded signal is more abundant, and the anti-interference ability of the encoded signal can be improved.

In FIG. 3, the output signal of encoding circuit 1 is encoded signal PC. Decoding circuit 3 may receive encoded signal PC through isolation element 2, can generate a rising edge at the output terminal when pulse sequence M1 is detected in encoded signal PC, and can generate a falling edge at the output terminal when pulse sequence M2 is detected in the encoded signal PC. Further, since the first and second pulse sequences have different time intervals, and the time intervals corresponding to the first and second pulse sequences are both determined, the decoding circuit may determine that pulse sequence M1 is detected when the time interval between pulse groups in the pulse sequence of encoded signal PC is detected to be T1, and then output the rising edge at the output terminal. When the time interval between pulses groups in the pulse sequence of encoded signal PC is detected to be T2, it can be determined that pulse sequence M2 is detected, and then the falling edge may be output at the output terminal. Therefore, the decoding circuit can accurately output the rising edge and the falling edge according to the time interval corresponding to the pulse sequence, and then may generate output digital signal DOUT consistent with the waveform of input digital signal DIN, thereby improving the anti-interference ability in the digital signal transmission process.

In particular embodiments, to facilitate the output of the encoded signal and the detection of rising and falling edges, the number of first pulse groups in the first pulse sequence in this example is the same as the number of second pulse groups in the second pulse sequence. It should be understood that the number of the first and second pulse groups in particular embodiments is not limited to 2, but may be more than 2. The number and type of the first and second pulse groups can be set according to particular needs. If the settings are increasingly complex, the anti-interference performance can be further improved.

In other examples, the first pulse sequence can include a plurality of identical first pulse groups, and the second pulse sequence can include a plurality of identical second pulse groups. For example, each first pulse group in the first pulse sequence may also take the same form as each second pulse group in the second pulse sequence. When the pulses in each first pulse group adopt the same form, the pulses in each second pulse group may adopt the same form, and each first pulse group and each second pulse group may adopt the same form, the number, polarity, width, amplitude, and arrangement of pulses in each first pulse group and second pulse group can be all the same. Therefore, by setting the same pulse group, it is convenient for the output of encoded signal and the detection of rising edge and falling edge.

As shown in FIG. 3, in this example, pulse sequence M1 corresponding to the rising edge of the input digital signal can include two identical first pulse groups (e.g., pulse groups M11 and M12), and the time interval between pulse groups M11 and M12 is T1. In addition, pulse sequence M2 corresponding to the falling edge of the input digital signal can include two identical second pulse groups (e.g., pulse groups M21 and M22), and the time interval between pulse groups M21 and M22 is T2. Here, pulse groups M11, M12, M21, and M22 may all adopt the same form. Therefore, the first pulse group and the second pulse group with the same form can be arranged, which may reduce the delay time of signal transmission and improve the overall service performance of the digital isolator, while also improving the anti-interference performance.

For example, when the first pulse sequence includes a plurality of identical first pulse groups, and the second pulse sequence includes a plurality of identical second pulse groups, the first and second pulse groups may adopt the same form or different forms. When the first and second pulse groups adopt different forms, the first and second pulse groups may be different in at least one of the number, width, polarity, amplitude, and/or arrangement of pulses.

In particular embodiments, the first pulse sequence may include a plurality of different first pulse groups, and the second pulse sequence may include a plurality of different second pulse groups. Here, this may indicate that the first pulse sequence includes at least two different first pulse groups and/or the second pulse sequence includes at least two different second pulse groups. When there are different first pulse groups, the pulses in different first pulse groups can be different in at least one of the number, width, polarity, amplitude, and/or arrangement. When there are different second pulse groups, the pulses in different second pulse groups can be different in at least one of the number, width, polarity, amplitude, and/or arrangement.

Figure 4:
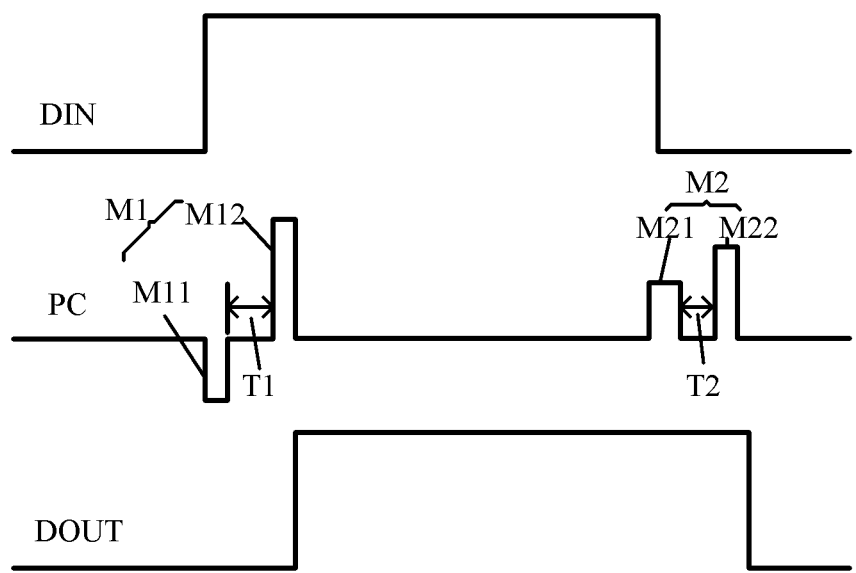
FIG. 4 is a waveform diagram of second example operation of the digital isolator, in accordance with embodiments of the present invention.

Referring now to FIG. 4, shown is a waveform diagram of second example operation of the digital isolator, in accordance with the embodiments of the present invention. In this particular example, pulse sequence M1 corresponding to the rising edge of input digital signal DIN can include two different first pulse groups (e.g., pulse groups M11 and M12), and the time interval between pulse groups M11 and M12 is T1. For example, the number of pulses in pulse groups M11 and M12 can be the same (e.g., there is one pulse in each first pulse group). The width of pulses in pulse groups M11 and M12 can be the same, but the polarity and amplitude of pulses in pulse groups M11 and M12 may respectively be different.

In addition, pulse sequence M2 corresponding to the falling edge of input digital signal DIN can include two different second pulse groups (e.g., pulse groups M21 and M22), and the time interval between pulse groups M21 and M22 is T2. The number of pulses in pulse groups M21 and M22 can be the same (e.g., there is one pulse in each second pulse group). The polarity of pulses in pulse groups M21 and M22 can be the same, but the width and amplitude of pulses in pulse groups M21 and M22 may respectively be different. Therefore, corresponding pulse groups can be formed by pulses with different pulse width, polarity, and/or amplitude attributes, and corresponding pulse sequences may be formed by setting different pulse groups in a predetermined arrangement according to a predetermined time interval. Thus, the rising edge and falling edge of the input digital signal may respectively be represented by different pulse sequences. As the first and second pulse sequences both include attribute information of corresponding pulse polarity, width, and/or amplitude, arrangement information, and time interval information of pulse groups, etc., the amount of information in the encoded signal is more abundant, thereby improving the anti-interference performance of the encoded signal.

Further, since pulse sequences M1 and M2 have different time intervals T1 and T2, and the corresponding time intervals T1 and T2 of pulse sequences M1 and M2 are both determined, the decoding circuit may determine that pulse sequence M1 is detected when the time interval between the pulse groups in the pulse sequence is detected to be T1, and then can generate the rising edge at the output terminal. When the time interval between the pulse groups in the pulse sequence is detected to be T2, it may be determined that pulse sequence M2 is detected, and then the falling edge may be output at the output terminal. Therefore, the decoding circuit can accurately output the rising edge and the falling edge according to the time interval corresponding to the pulse sequence, and then may generate output digital signal DOUT with the same waveform as input digital signal DIN, and improve the anti-interference ability in the digital signal transmission process.

In order to facilitate the output of encoded signals and the detection of rising and falling edges, the number of pulses in the first and second pulse groups in this example may be the same. It should be understood that the number of pulses in the first and second pulse groups can respectively be one as an example, but the first and second pulse groups can include a plurality of pulses, respectively. The number of pulses in the first and second pulse groups can be set according to particular application needs. If the number of pulses is increased, the anti-interference ability can accordingly be improved.

Further, the first pulse group can include a plurality of identical pulses, and the second pulse group can include a plurality of identical pulses. When both the first and second pulse groups include a plurality of identical pulses, that is, each pulse in each pulse group adopts the same form, this can indicate that the polarity, width, amplitude, and/or other attributes of each pulse are the same. Therefore, by setting a relatively large number of pulses, the encoding information in the pulse sequence can further be enriched, and the anti-interference ability in the process of digital signal transmission may be improved. Furthermore, by setting the pulses in one first pulse group in the same form, and setting the pulses in one second pulse group in the same form, the anti-interference ability can be improved. In addition, the overall complexity of the circuit may be reduced, the delay time of signal transmission reduced, and the overall performance of the digital isolator improved.

Figure 5:
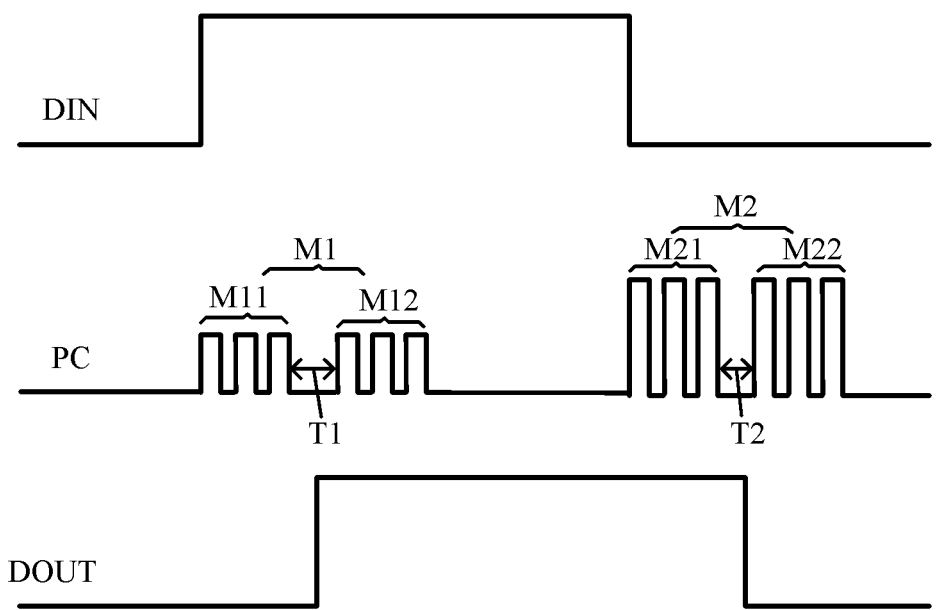
FIG. 5 is a waveform diagram of third example operation of the digital isolator, in accordance with embodiments of the present invention.

Referring to FIG. 5, shown is a waveform diagram of third example operation of the digital isolator, in accordance with the embodiments of the present invention. In this particular example, pulse sequence M1 corresponding to the rising edge of input digital signal DIN can include two first pulse groups (e.g., pulse groups M11 and M12). In this example, the time interval between pulse groups M11 and M12 is T1, and pulse groups M11 and M12 can be in the same form. For example, each first pulse group can include three pulses, and each pulse in the first pulse group may have the same polarity, width, amplitude, and arrangement. Pulse sequence M2 corresponding to the falling edge of input digital signal DIN can include two second pulse groups (e.g., pulse groups M21 and M22). In this example, the time interval between pulse groups M21 and M22 is T2, and pulse groups M21 and M22 may be in the same form. For example, each second pulse group can include three pulses, and each pulse in the second pulse group has the same polarity, width, amplitude, and arrangement.

In addition, the pulses in pulse groups M11 and M21 can be different in pulse amplitude, while other features (e.g., the width and polarity of the pulses) are the same. Therefore, the first and second pulse groups may respectively be formed by three pulses with the same pulse polarity, width, and amplitude. Then, the first pulse sequence can be formed by arranging the same first pulse groups according to a predetermined time interval, and the second pulse sequence can be formed by arranging the same second pulse groups according to another predetermined time interval. Thus, the rising edge and the falling edge of the input digital signal can respectively be represented by different pulse sequences. As the first and second pulse sequences both include attribute information of the polarity, width, and amplitude of the corresponding pulses, arrangement information, and time interval information of the pulse groups, etc., the information in the encoding signal becomes more abundant, thus improving the anti-interference ability of the encoded signal. Moreover, by setting the first pulse group with the same form and the second pulse group with the same form, the delay time of signal transmission can be reduced, and the overall service performance of the digital isolator improved, while also improving the anti-interference performance.

In FIG. 5, the output signal of encoding circuit 1 is encoded signal PC. Decoding circuit 3 may receive encoded signal PC through isolation element 2, and can generate a rising edge at the output terminal when pulse sequence M1 is detected in encoded signal PC, and may generate a falling edge at the output terminal when pulse sequence M2 is detected in encoded signal PC. For example, decoding circuit 3 can determine that pulse sequence M1 is detected when the time interval between the pulse groups in the pulse sequence of encoded signal PC is T1, and then may generate the rising edge at the output terminal. When the time interval between the pulse groups in the pulse sequence of encoded signal PC is detected to be T2, it can be determined that pulse sequence M2 is detected, and the falling edge may be output at the output terminal. Therefore, decoding circuit 3 can accurately output the rising edge and the falling edge according to the time interval corresponding to the pulse sequence, and then can generate/activate output digital signal DOUT with the same waveform as input digital signal DIN, thereby improving the anti-interference ability in the digital signal transmission process.

In some embodiments, when the first pulse group includes a plurality of identical pulses, and the second pulse group includes a plurality of identical pulses, the number of pulses in each of the first and second pulse groups can be the same. Also, the pulses in the first pulse group and the pulses in the second pulse group may be the same, or different. When the pulses in the first and second pulse groups are the same, this can indicate that the polarity, width, and amplitude of the corresponding pulses in the first and second pulse groups are the same. When the pulses in the first and second pulse groups are different, this can indicate that at least one of the polarity, width, amplitude, and other attributes of the corresponding pulses in the first and second pulse groups are different. Further, the corresponding pulses may appear in the same order in their respective pulse sequences.

In other embodiments, the first pulse group can include a plurality of different pulses, and when each pulse in the first pulse group takes a different form, at least one of the corresponding polarity, width, and amplitude of the pulses in the first pulse group may be different. Further, the second pulse group can include a plurality of different pulses, and when each pulse in the second pulse group takes a different form, at least one of the corresponding polarity, width, and amplitude of the pulses in the second pulse group may be different.

Figure 6:
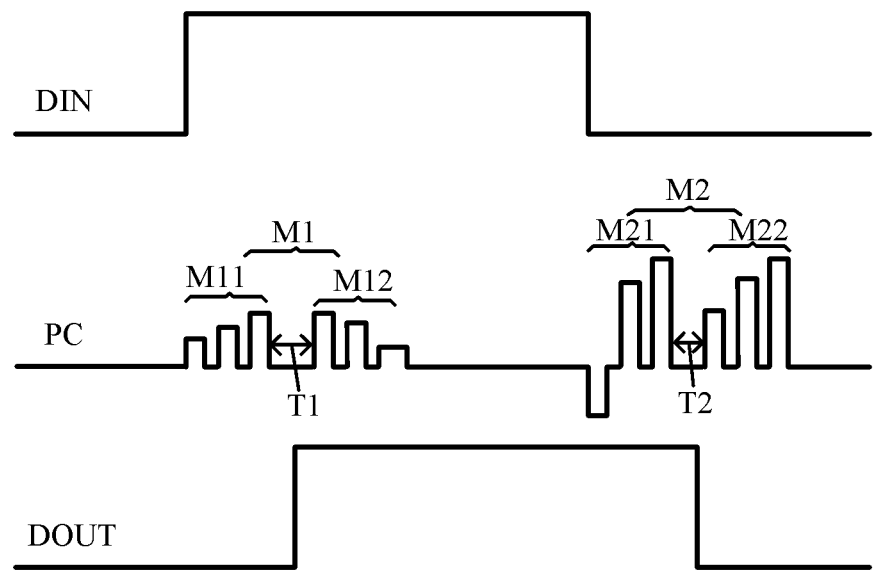
FIG. 6 is a waveform diagram of fourth example operation of the digital isolator, in accordance with embodiments of the present invention.

Referring now to FIG. 6, shown is a waveform diagram of fourth example operation of the digital isolator, in accordance with the embodiments of the present invention. In this particular example, pulse sequence M1 corresponding to the rising edge of input digital signal DIN can include two different first pulse groups (e.g., pulse groups M11 and M12). The time interval between pulse groups M11 and M12 is T1. For example, pulse group M11 can include three pulses. The pulses in pulse group M11 may have the same polarity and width, but different amplitudes. The number of pulses in pulse group M12 can be the same as that in pulse group M11. The three pulses in pulse group M12 may have the same pulse polarity but different amplitudes, and the width of one pulse (e.g., the last pulse) in pulse group M12 may also be different from the other two pulses.

In addition, pulse sequence M2 corresponding to the falling edge of input digital signal DIN can include two different second pulse groups (e.g., pulse groups M21 and M22). The time interval between pulse groups M21 and M22 is T2, and the two second pulse groups each may include three different pulses. The three pulses in pulse group M21 may have the same width but different amplitudes. In addition, the polarity of one pulse (e.g., the first pulse) in pulse group M21 can be negative, and the polarity of the other two pulses may be positive. That is, the polarities of the pulses in pulse group M21 are different in this example. Further, the width and polarity of the three pulses in pulse group M22 may be the same, but the amplitudes of the pulses can all be different. Therefore, in this particular arrangement, the amount of information in the encoded signal can be more abundant, and the anti-interference ability of the encoded signal further improved.

In the example of FIG. 6, since pulse sequence M1 and pulse sequence M2 have different time intervals T1 and T2, and the corresponding time intervals T1 and T2 of pulse sequences M1 and M2 may both be determined, the decoding circuit can determine that pulse sequence M1 is detected when the time interval between the pulse groups in the pulse sequence of encoded signal PC is T1, and then may output the rising edge at the output terminal. When the time interval between the pulse groups in the pulse sequence of encoded signal PC is detected to be T2, it can be determined that pulse sequence M2 is detected, and the falling edge may be output at the output terminal. Therefore, the decoding circuit can accurately generate the rising edge and the falling edge according to the time interval corresponding to the pulse sequence, and then may generate output digital signal DOUT with the same waveform as input digital signal DIN, thereby improving the anti-interference ability in the digital signal transmission process.

Figure 7:
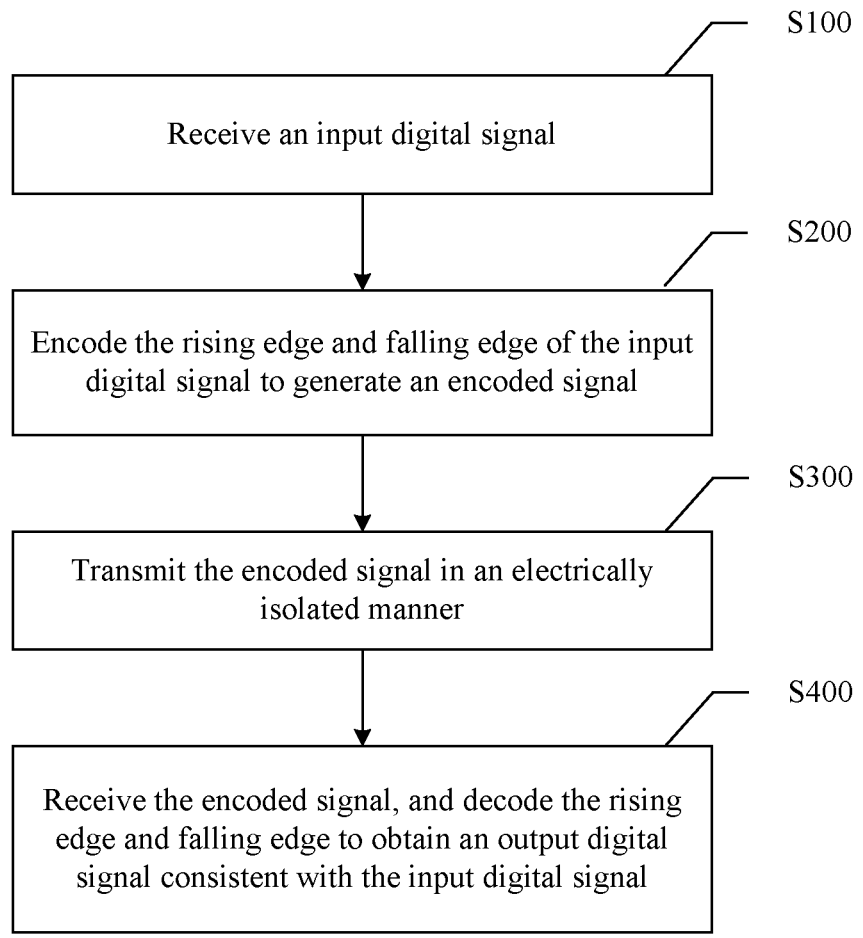
FIG. 7 is a flow chart of an example digital signal transmission method, in accordance with embodiments of the present invention.

Referring now to FIG. 7, shown is a flow chart of an example digital signal transmission method, in accordance with the embodiments of the present invention. In this particular example, the digital signal transmission method can include the following steps. At S100, an input digital signal can be received. In this example, the input digital signal can be received through the input terminal of the encoding circuit. At S200, the rising edge and the falling edge of the input digital signal can respectively be encoded, in order to generate an encoded signal. In this example, the rising edge and the falling edge of the input digital signal can be encoded by the encoding circuit. The encoding circuit can include an edge detection circuit, a signal modulator, and a carrier generator. S200 can also include generating the encoded signal after detecting the rising edge or the falling edge. When the encoding circuit outputs the encoded signal, it can output a single-channel signal or a differential signal.

Further, the rising edge can be encoded as the first pulse sequence, and the falling edge maybe encoded as the second pulse sequence. The first pulse sequence can include a plurality of first pulse groups, and the time interval between the first pulse groups is the first time. The second pulse sequence can include a plurality of second pulse groups, the time interval between the second pulse groups is the second time, and the first time and the second time are different. Each first pulse group and second pulse group can include at least one pulse.

For example, the setting mode of the first and second pulse sequences can be any one of the above-mentioned pulse sequence setting modes. At S300, the encoded signal can be transmitted in an electrically isolated manner. In this example, the encoded signal is transmitted in an electrically isolated manner through the isolation element. For example, the isolation element can be a capacitor or a micro transformer. When the encoding circuit outputs a single-channel signal, a single-ended transmission isolation element may be adopted. When the encoding circuit outputs a two-channel differential signal, the differential transmission isolation element can be adopted to further improve the anti-interference ability in the process of pulse sequence transmission and the anti-interference performance of the digital isolator.

At S400, the encoded signal can be received and the rising edge and falling edge may be decoded to obtain an output digital signal consistent with the input digital signal. In this example, the encoded signal can be received by the decoding circuit, and the rising edge and falling edge may be decoded and output. The decoding circuit can include an edge detection circuit, a signal modulator, and a carrier generator. S400 can also include generating the rising edge after receiving the first pulse sequence, and generating the falling edge after receiving the second pulse sequence.

Further, since the first and second pulse sequences may have different time intervals, and the time intervals corresponding to the first and second pulse sequences may both be determined, the decoding circuit can determine that the first pulse sequence is detected when the time interval between the pulse groups of the pulse sequence in the encoded signal is the first time, and may output the rising edge at the output terminal. When the time interval between the pulse groups of the pulse sequence in the encoded signal is the second time, it can be determined that the second pulse sequence is detected, and the falling edge maybe output at the output terminal. Therefore, the decoding circuit can accurately output the rising edge and the falling edge according to the time interval corresponding to the pulse sequence, and may further generate the output digital signal consistent with the waveform of the input digital signal, thereby improving the anti-interference ability in the digital signal transmission process.

In particular embodiments, the rising edge and the falling edge of the input digital signal can be redundantly encoded, and the rising edge and the falling edge maybe respectively characterized by a first pulse sequence including first pulse groups with a first time interval, and a second pulse sequence including second pulse groups with a second time interval. As more information is added to the encoded information, the rising edge and falling edge information can be accurately transmitted through the isolation element, and the anti-interference performance accordingly improved. In addition, the decoding circuit can accurately output the rising edge and the falling edge according to the time intervals corresponding to the pulse sequences, and then may generate the output digital signal consistent with the waveform of the input digital signal, thereby improving the anti-interference ability in the process of digital signal transmission.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A digital isolator comprising:
   a) an encoding circuit configured to receive and encode an input digital signal, in order to generate an encoded signal, wherein a rising edge of the input digital signal is encoded as a first pulse sequence, and a falling edge of the input digital signal is encoded as a second pulse sequence;
   b) an isolation element comprising a capacitor or a transformer, the isolation element being coupled to the encoding circuit, and being configured to transmit the encoded signal in an electrically isolated manner; and
   c) a decoding circuit configured to receive the encoded signal through the isolation element, and to decode the encoded signal, in order to generate an output digital signal consistent with the input digital signal,
   d) wherein the first pulse sequence comprises a plurality of first pulse groups, and a time interval between the first pulse groups is a first time, wherein the second pulse sequence comprises a plurality of second pulse groups, and a time interval between the second pulse groups is a second time different from the first time, and wherein each of the first pulse groups and the second pulse groups comprises at least one pulse.

2. The digital isolator of claim 1, wherein:
   a) the encoding circuit is configured to generate the encoded signal when detecting the rising edge or the falling edge of the input digital signal; and
   b) the decoding circuit is configured to generate a rising edge when the first pulse sequence in the encoded signal is detected, and to generate a falling edge when the second pulse sequence in the encoded signal is detected.

3. The digital isolator of claim 1, wherein a number of the first pulse groups in the first pulse sequence is the same as a number of the second pulse groups in the second pulse sequence.

4. The digital isolator of claim 1, wherein the first pulse sequence comprises a plurality of identical first pulse groups, and the second pulse sequence comprises a plurality of identical second pulse groups.

5. The digital isolator of claim 4, wherein each first pulse group and each second pulse group are different in at least one of a number, an amplitude, a width, a polarity, and an arrangement of pulses.

6. The digital isolator of claim 1, wherein the first pulse sequence comprises a plurality of different first pulse groups, and the second pulse sequence comprises a plurality of different second pulse groups.

7. The digital isolator of claim 6, wherein pulses in the different first pulse groups are different in at least one of an amplitude, a width, a polarity, and an arrangement.

8. The digital isolator of claim 6, wherein pulses in the different second pulse groups are different in at least one of an amplitude, a width, a polarity, and an arrangement.

9. The digital isolator of claim 1, wherein a number of pulses in each first pulse group and each second pulse group is the same.

10. The digital isolator of claim 9, wherein pulses in each first pulse group and pulses in each second pulse group are different in at least one of a polarity, a width, and an amplitude.

11. The digital isolator of claim 1, wherein each first pulse group comprises a plurality of identical pulses, and each second pulse group comprises a plurality of identical pulses.

12. The digital isolator of claim 1, wherein each first pulse group comprises a plurality of pulses that are different in at least one of a polarity, a width, and an amplitude.

13. The digital isolator of claim 1, wherein each second pulse group comprises a plurality of pulses that are different in at least one of a polarity, a width, and an amplitude.

14. A method of digital signal transmission, the method comprising:
- a) receiving and encoding an input digital signal to generate an encoded signal;
- b) encoding a rising edge of the input digital signal as a first pulse sequence, and a falling edge of the input digital signal as a second pulse sequence;
- c) transmitting the encoded signal in an electrically isolated manner; and
- d) receiving and decoding the encoded signal to generate an output digital signal consistent with the input digital signal,
- e) wherein the first pulse sequence comprises a plurality of first pulse groups, and a time interval between the first pulse groups is a first time, wherein the second pulse sequence comprises a plurality of second pulse groups, and a time interval between the second pulse groups is a second time different from the first time, and wherein each of the first pulse groups and the second pulse groups comprises at least one pulse.

15. The method of claim 14, further comprising:
- a) generating the encoded signal when detecting the rising edge or the falling edge of the input digital signal;
- b) generating a rising edge when the first pulse sequence in the encoded signal is detected; and
- c) generating a falling edge when the second pulse sequence in the encoded signal is detected.

16. The method of claim 14, wherein the first pulse sequence comprises a plurality of identical first pulse groups, and the second pulse sequence comprises a plurality of identical second pulse groups.

17. The method of claim 16, wherein each first pulse group and each second pulse group are different in at least one of a number, an amplitude, a width, a polarity, and an arrangement of pulses.

18. The method of claim 14, wherein the first pulse sequence comprises a plurality of different first pulse groups, and the second pulse sequence comprises a plurality of different second pulse groups.

19. The method of claim 18, wherein pulses in the different first pulse groups are different in at least one of an amplitude, a width, a polarity, and an arrangement.

20. The method of claim 18, wherein pulses in the different second pulse groups are different in at least one of an amplitude, a width, a polarity, and an arrangement.

* * * * *